United States Patent
Morishima et al.

(10) Patent No.: US 9,520,527 B1
(45) Date of Patent: Dec. 13, 2016

(54) NITRIDE SEMICONDUCTOR TEMPLATE AND ULTRAVIOLET LED

(71) Applicants: TAMURA CORPORATION, Tokyo (JP); RIKEN, Saitama (JP)

(72) Inventors: Yoshikatsu Morishima, Tokyo (JP); Hideki Hirayama, Saitama (JP)

(73) Assignees: RIKEN, Saitama (JP); TAMURA CORPORATION, Tokyo (JP)

( * ) Notice: Subject to any disclaimer, the term of this patent is extended or adjusted under 35 U.S.C. 154(b) by 0 days.

(21) Appl. No.: 15/050,655

(22) Filed: Feb. 23, 2016

(30) Foreign Application Priority Data

Jun. 29, 2015 (JP) .................. 2015-130442

(51) Int. Cl.
| | |
|---|---|
| *H01L 29/66* | (2006.01) |
| *H01L 21/336* | (2006.01) |
| *H01L 31/18* | (2006.01) |
| *H01L 31/0304* | (2006.01) |

(52) U.S. Cl.
CPC ..... *H01L 31/1848* (2013.01); *H01L 31/03048* (2013.01); *H01L 2924/10344* (2013.01); *H01L 2924/10356* (2013.01)

(58) Field of Classification Search
CPC ................ H01L 31/1846; H01L 31/03048
USPC ............ 257/190–194; 438/167, 285, 59, 936
See application file for complete search history.

(56) References Cited

U.S. PATENT DOCUMENTS

| 8,698,198 B2 * | 4/2014 | Kuraguchi | H01L 29/2003 257/190 |
|---|---|---|---|
| 8,779,438 B2 * | 7/2014 | Hikita | H01L 29/7783 257/192 |
| 2014/0048823 A1 | 2/2014 | Sato et al. | |

FOREIGN PATENT DOCUMENTS

JP    2014-199935 A    10/2014

OTHER PUBLICATIONS

Morishima, Yoshikatsu et al., "Growth of AlGaN (0001) epitaxial layer on Ga2O3 (-201) substrate", 62nd Spring Meeting of the Japan Society of Applied Physics (2015), Tokai University, Shonan Campus, Abstract only.

* cited by examiner

*Primary Examiner* — Calvin Lee
(74) *Attorney, Agent, or Firm* — Scully, Scott, Murphy & Presser, PC

(57) ABSTRACT

A nitride semiconductor template includes a $Ga_2O_3$ substrate, a buffer layer that includes as a main component AlN and is formed on the $Ga_2O_3$ substrate, a first nitride semiconductor layer that includes as a main component $Al_xGa_{1-x}N$ ($0.2<x\leq 1$) and is formed on the buffer layer, a second nitride semiconductor layer that includes as a main component $Al_yGa_{1-y}N$ ($0.2\leq y\leq 0.55$, $y<x$) and is formed on the first nitride semiconductor layer, and a third nitride semiconductor layer that is formed on the second nitride semiconductor layer and includes a multilayer structure including an $In_{u1}Al_{v1}Ga_{w1}N$ ($0.02\leq u1\leq 0.03$, $u1+v1+w1=1$) layer and $In_{u2}Al_{v2}Ga_{w2}N$ ($0.02\leq u2\leq 0.03$, $u2+v2+w2=1$, $v1+0.05\leq v2\leq v1+0.2$) layers on both sides of the $In_{u1}Al_{v1}Ga_{w1}N$ layer.

16 Claims, 7 Drawing Sheets

NITRIDE SEMICONDUCTOR TEMPLATE AND ULTRAVIOLET LED

The present application is based on Japanese patent application No. 2015-130442 filed on Jun. 29, 2015, the entire contents of which are incorporated herein by reference.

BACKGROUND OF THE INVENTION

1. Field of the Invention

The invention relates to a nitride semiconductor template and a ultraviolet (UV) LED.

2. Description of the Related Art

A nitride semiconductor template is known in which a nitride semiconductor layer is formed on a $Ga_2O_3$ substrate via an AlN buffer layer (see e.g., JP-A-2014-199935).

According to JP-A-2014-199935, the nitride semiconductor layer can be provided with a mirror surface by appropriately selecting a plane orientation of a main surface of the $Ga_2O_3$ substrate.

SUMMARY OF THE INVENTION

The conditions for prevention of pits or cracks on the nitride semiconductor are different depending on the ratio of the Al composition of the nitride semiconductor. Thus, the optimal method of forming the nitride semiconductor on the $Ga_2O_3$ substrate needs to be chosen for each composition to obtain a higher-quality nitride semiconductor.

In recent years, ultraviolet LEDs in the wavelength range of not more than 365 nm have been developed so as to replace high-pressure mercury lamps used for curing etc.

It is an object of the invention to provide a transparent conductive nitride semiconductor template that is provided with a high-quality nitride semiconductor, and suited to ultraviolet LEDs, as well as an ultraviolet LED manufactured by using the nitride semiconductor template.

According to an embodiment of the invention, a nitride semiconductor template as defined in [1] to [5] below and an ultraviolet LED manufactured by using the template as defined in [6] below are provided.

[1] A nitride semiconductor template, comprising:
a $Ga_2O_3$ substrate;
a buffer layer that comprises as a main component AlN and is formed on the $Ga_2O_3$ substrate;
a first nitride semiconductor layer that comprises as a main component $Al_xGa_{1-x}N$ ($0.2<x\leq1$) and is formed on the buffer layer;
a second nitride semiconductor layer that comprises as a main component $Al_yGa_{1-y}N$ ($0.2\leq y\leq0.55$, $y<x$) and is formed on the first nitride semiconductor layer; and
a third nitride semiconductor layer that is formed on the second nitride semiconductor layer and comprises a multi-layer structure including an $In_{u1}Al_{v1}Ga_{w1}N$ ($0.02\leq u1\leq0.03$, $u1+v1+w1=1$) layer and $In_{u2}Al_{v2}Ga_{w2}N$ ($0.02\leq u2\leq0.03$, $u2+v2+w2=1$, $v1+0.05\leq v2\leq v1+0.2$) layers on both sides of the $In_{u1}Al_{v1}Ga_{w1}N$ layer.

[2] The nitride semiconductor template according to [1], wherein the buffer layer is not more than 10 nm in thickness.

[3] The nitride semiconductor template according to [1] or [2], wherein the second nitride semiconductor layer has no crack on a surface thereof.

[4] The nitride semiconductor template according to any one of [1] to [3], wherein the second nitride semiconductor layer has no pit on a surface thereof.

[5] The nitride semiconductor template according to any one of [1] to [4], wherein the second nitride semiconductor layer has a dislocation density of not more than $2.0\times10^{10}$ $cm^2$.

[6] An ultraviolet LED, comprising the nitride semiconductor template according to any one of [1] to [5].

Effects of the Invention

According to an embodiment of the invention, a transparent conductive nitride semiconductor template can be provided that is provided with a high-quality nitride semiconductor, and suited to ultraviolet LEDs, as well as an ultraviolet LED manufactured by using the nitride semiconductor template.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Structure of Nitride Semiconductor Template

Figure 1:
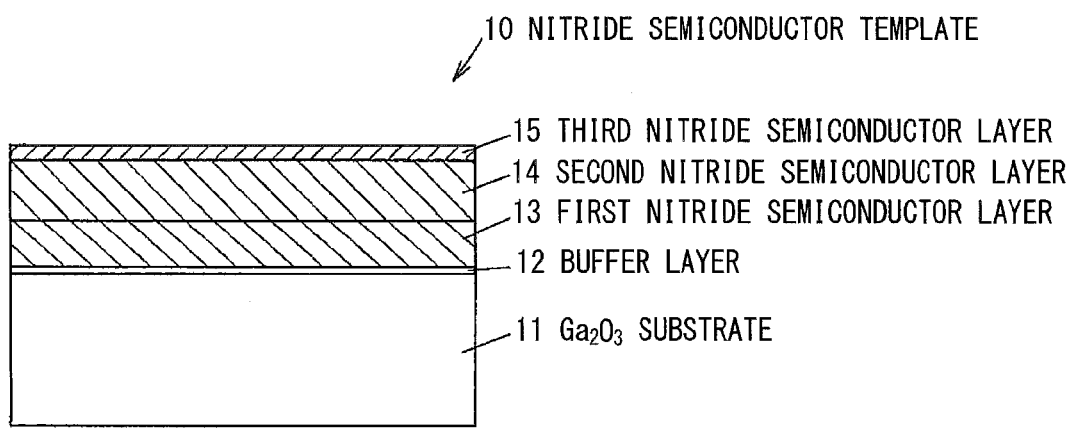
FIG. 1 is a vertical cross-sectional view showing a nitride semiconductor template in a first embodiment.

FIG. 1 is a vertical cross-sectional view showing a nitride semiconductor template 10 in the first embodiment. The nitride semiconductor template 10 is a template suitable for ultraviolet LEDs with an emission wavelength of 300 to 360 nm.

The nitride semiconductor template 10 includes a $Ga_2O_3$ substrate 11, a buffer layer 12 on the $Ga_2O_3$ substrate 11, a first nitride semiconductor layer 13 on the buffer layer 12, a second nitride semiconductor layer 14 on the first nitride semiconductor layer 13, and a third nitride semiconductor layer 15 on the second nitride semiconductor layer 14.

The $Ga_2O_3$ substrate 11 is formed of a $\beta$-$Ga_2O_3$ single crystal. The main surface of the $Ga_2O_3$ substrate 11 is a (−201) plane, a (010) plane, a (310) plane, a (3-10) plane or planes inclined from these planes within a range of about ±2°, which can be a base for growth of high-quality nitride semiconductor crystal. The $Ga_2O_3$ substrate 11 is, e.g., a circular substrate having a diameter of 50.8 mm (2 inches), but the shape and size thereof are not limited.

Since $Ga_2O_3$ hardly absorbs light with a wavelength of not less than 300 nm, the $Ga_2O_3$ substrate 11 is excellent as a substrate of the nitride semiconductor template 10 which is used to form a UV LED with an emission wavelength of not less than 300 nm. On the other hand, e.g., GaN well absorbs light with a wavelength of not more than 365 nm and GaN substrates are thus not suitable as UV LED templates. Therefore, to prevent a decrease in light extraction efficiency, the GaN substrates need to be removed after manufacturing LEDs.

In addition, the $Ga_2O_3$ substrate 11, which contains a dopant such as Si or Sn and has excellent conductivity, is excellent as an LED substrate. On the other hand, when a low-conductivity substrate, e.g., a sapphire substrate, is used, it is not possible to form vertical-type LEDs, and horizontal-type LEDs, if formed, have high electrical resistance since an electric current flows through a thin nitride semiconductor layer on the substrate.

The buffer layer 12 consists mainly of AlN. The buffer layer 12 may cover the entire upper surface of the $Ga_2O_3$ substrate 11 as shown in FIG. 1, or may partially cover the upper surface of the $Ga_2O_3$ substrate 11. To obtain higher crystal quality, the thickness of the buffer layer 12 is preferably not more than 10 nm, more preferably, not more than 5 nm.

The second nitride semiconductor layer 14 is used as a cladding layer in a UV LED which is formed using the nitride semiconductor template 10. To form a UV LED with an emission wavelength of 300 to 360 nm, the second nitride semiconductor layer 14 to be a cladding layer need to have a composition roughly represented by $Al_yGa_{1-y}N$ ($0.2 \leq y \leq 0.55$).

The Al composition of the first nitride semiconductor layer 13 is greater than that of the second nitride semiconductor layer 14. In other words, the composition of the first nitride semiconductor layer 13 is expressed by $Al_xGa_{1-x}N$ ($0.2 \leq x \leq 1$), and the Al composition-x of the first nitride semiconductor layer 13 and the Al composition-y of the second nitride semiconductor layer 14 satisfy the relation of y<x. The first nitride semiconductor layer 13 having such a composition allows the second nitride semiconductor layer 14 to have a mirror surface and generation of cracks and pits to be suppressed.

The first nitride semiconductor layer 13 and the second nitride semiconductor layer 14 may contain a dopant such as Si. The thickness of the first nitride semiconductor layer 13 is, e.g., 100 to 300 nm. The thickness of the second nitride semiconductor layer 14 is, e.g., 1 to 2 µm.

The surface of the second nitride semiconductor layer 14 is a mirror surface and hardly contains, or does not contain cracks and pits (hole-like defects) at all.

If the second nitride semiconductor layer 14 is formed on the buffer layer 12 without providing the first nitride semiconductor layer 13, cracks are generated on the surface of the second nitride semiconductor layer 14. Meanwhile, when only the first nitride semiconductor layer 13 is formed on the buffer layer 12 without providing the second nitride semiconductor layer 14, a mirror surface cannot be obtained.

The third nitride semiconductor layer 15 has a multilayer structure including a structure in which $In_{u1}Al_{v1}Ga_{w1}N$ ($0.02 \leq u1 \leq 0.03$, $u1+v1+w1=1$) layers are sandwiched from both sides between $In_{u2}Al_{v2}Ga_{w2}N$ ($0.02 \leq u2 \leq 0.03$, $u2+v2+w2=1$, $v1+0.05 \leq v2 \leq v1+0.2$) layers. A typical structure of the third nitride semiconductor layer 15 is a structure composed of three $In_{0.02}Al_{0.19}Ga_{0.79}N$ layers and four $In_{0.02}Al_{0.29}Ga_{0.69}N$ layers in total, two of which are formed between the $In_{0.02}Al_{0.19}Ga_{0.79}N$ layers and one as the uppermost layer and one as the lowermost layer.

In the third nitride semiconductor layer 15, the thickness of the $In_{u1}Al_{v1}Ga_{w1}N$ layer is, e.g., 2 nm, and the thickness of the $In_{u2}Al_{v2}Ga_{w2}N$ layer is, e.g., 5 nm.

The third nitride semiconductor layer 15 is a layer which functions as a light-emitting layer having a quantum well structure in the IV LED manufactured using the nitride semiconductor template 10. The $In_{u1}Al_{v1}Ga_{w1}N$ layer functions as a well layer and the $In_{u2}Al_{v2}Ga_{w2}N$ layer functions as a barrier layer. By adjusting the $In_{u1}Al_{v1}Ga_{w1}N$ layer to have the Al composition v1 of, e.g., not less than 0 and not more than 0.3, it is possible to obtain an LED with an emission wavelength of about 300 to 360 nm.

Method of Manufacturing Nitride Semiconductor Template

An example method of manufacturing the nitride semiconductor template 10 will be described below.

Firstly, the $Ga_2O_3$ substrate 11 treated by CMP (Chemical Mechanical Polishing) is cleaned with an organic solvent and SPM (Sulfuric acid/hydrogen peroxide mixture).

Next, the $Ga_2O_3$ substrate 11 is conveyed to a chamber of a MOCVD (Metal Organic Chemical Vapor Deposition) apparatus.

Next, the buffer layer 12 is formed on the $Ga_2O_3$ substrate 11. AlN is grown on the $Ga_2O_3$ substrate 11 by supplying source gases and $N_2$ gas as a carrier gas into the chamber with a temperature maintained at 400 to 600° C. (e.g., 550° C.), thereby forming the buffer layer 12 in the form of film.

The source gases used to form the buffer layer 12 are, e.g., trimethylaluminum (TMA) gas as an Al source and $NH_3$ gas as an N source. The carrier gas may be alternatively $H_2$ gas etc.

Next, the first nitride semiconductor layer 13 is formed on the buffer layer 12. In detail, for example, source gases for the first nitride semiconductor layer 13 and $H_2$ gas as a carrier gas are supplied into the chamber with pressure maintained at 100 mbar and temperature maintained at not less than 885° C. (e.g., 1020° C.), thereby growing the first nitride semiconductor layer 13.

The source gases used to form the first nitride semiconductor layer 13 are, e.g., trimethylaluminum (TMA) gas as an Al source, trimethylgallium (TMG) gas as Ga source and $NH_3$ gas as an N source. The carrier gas may be alternatively $N_2$ gas etc.

Next, the second nitride semiconductor layer 14 is formed on the first nitride semiconductor layer 13. In detail, for example, source gases for the second nitride semiconductor layer 14 and $H_2$ gas as a carrier gas are supplied into the chamber with a temperature maintained at not less than 1100° C. (e.g., 1120° C.), thereby growing the second nitride semiconductor layer 14.

Here, generation of pits can be suppressed when the second nitride semiconductor layer 14 is grown at a growth temperature of more than 1100° C. Furthermore, generation of pits can be suppressed more reliably when the second nitride semiconductor layer 14 is grown at a growth temperature of more than 1120° C.

The source gases for the second nitride semiconductor layer 14 may be the same as those for the first nitride semiconductor layer 13. The carrier gas may be alternatively $N_2$ gas etc.

The second nitride semiconductor layer 14 has a composition expressed by $Al_yGa_{1-y}N$ ($0.2 \leq y \leq 0.55$), as described above. It is not necessary to change the growth conditions such as growth temperature even when the composition is changed as long as the composition falls into such a range. In other words, even if the growth conditions are not changed, defects such as cracks and pits are not generated and a decrease in crystal quality (an increase in dislocation density) does not occur.

Next, the third nitride semiconductor layer 15 is formed on the second nitride semiconductor layer 14. In detail, for example, source gases for the third nitride semiconductor layer 15 and $N_2$ gas as a carrier gas are supplied into the chamber with a temperature maintained at 830 to 950° C. (e.g., 880° C.), thereby growing the third nitride semiconductor layer 15.

The source gases used to form the third nitride semiconductor layer 15 are, e.g., trimethylindium (TMI) gas as an In source, trimethylaluminum (TMA) gas as an Al source, trimethylgallium (TMG) gas as a Ga source and $NH_3$ gas and $NH_3$ gas as an N source. The carrier gas may be alternatively $H_2$ gas, etc.

Evaluation of Second Nitride Semiconductor Layer

Table 1 below shows the growth conditions of each layer and the results of evaluating the surface state of the second nitride semiconductor layers.

Each of the $Ga_2O_3$ substrates of seven types of nitride semiconductor templates (Samples 1 to 7) used for evaluation was a 2 inch-diameter circular substrate having a (−201) plane as the main surface. Trimethylaluminum (TMA) gas, trimethylgallium (TMG) gas and $NH_3$ gas were respectively used as the Al source, the Ga source and the N source for the first and second nitride semiconductor layers.

In Sample 3, cracks were generated on the surface of the second nitride semiconductor layer. It is considered that this is because the Al composition of the first nitride semiconductor layer was the same as that of the second nitride semiconductor layer.

In Sample 4, pits were generated on the surface of the second nitride semiconductor layer. It is considered that this is because growth of the crystal in the lateral direction was insufficient when the second nitride semiconductor layer was grown at a temperature of 1100° C.

In Sample 5, none of cracks and pits were generated on the surface of the second nitride semiconductor layer. It is considered that this is mainly because the first and second nitride semiconductor layers were both formed and the Al composition of the second nitride semiconductor layer was smaller than that of the first nitride semiconductor layer. The reason why pits were not generated is considered that the second nitride semiconductor layer was grown at a temperature of 1120° C., i.e., higher than 1100° C.

Sample 6 was the same as Sample 5, except that the material of the first nitride semiconductor layer was changed to $Al_{0.8}Ga_{0.2}N$ from AlN used in Sample 5 to decrease electrical resistance of the first nitride semiconductor layer. Also in Sample 6, none of cracks and pits were generated.

In Sample 7, the Al composition of the second nitride semiconductor layer was increased to more than that of

TABLE 1

| Sample No. | Buffer layer | | First nitride semiconductor layer | | Second nitride semiconductor layer | | Surface state | | |
|---|---|---|---|---|---|---|---|---|---|
| | Film thickness [nm] | Growth temperature [° C.] | Composition | Growth temperature [° C.] | Composition | Growth temperature [° C.] | Etched state of $Ga_2O_3$ substrate | Pit | Crack |
| 1 | 5 | 550 | none | — | $Al_{0.3}Ga_{0.7}N$ | 1100 | etched | observed | observed |
| 2 | 5 | 800 | none | — | $Al_{0.3}Ga_{0.7}N$ | 1100 | etched | observed | observed |
| 3 | 5 | 550 | $Al_{0.3}Ga_{0.7}N$ | 1020 | $Al_{0.3}Ga_{0.7}N$ | 1100 | not etched | observed | observed |
| 4 | 5 | 550 | AlN | 1020 | $Al_{0.3}Ga_{0.7}N$ | 1100 | not etched | observed | not observed |
| 5 | 5 | 550 | AlN | 1020 | $Al_{0.3}Ga_{0.7}N$ | 1120 | not etched | not observed | not observed |
| 6 | 5 | 550 | $Al_{0.8}Ga_{0.2}N$ | 1020 | $Al_{0.3}Ga_{0.7}N$ | 1120 | not etched | not observed | not observed |
| 7 | 5 | 550 | $Al_{0.8}Ga_{0.2}N$ | 1020 | $Al_{0.45}Ga_{0.55}N$ | 1120 | not etched | not observed | not observed |

The second nitride semiconductor layer of each of Samples 1 to 7 was grown at a growth rate of 2 μm/h.

In Samples 1 and 2, the second nitride semiconductor layer was directly formed on the buffer layer without forming the first nitride semiconductor layer. Pits and cracks were generated on the surface of the second nitride semiconductor layer of Sample 1 and a mirror surface was obtained only in a 25 mm-diameter region. Likewise, pits and cracks were generated also on the surface of the second nitride semiconductor layer of Sample 2. It is considered that this is because the first nitride semiconductor layer was not formed.

Meanwhile, in Sample 1, the $Ga_2O_3$ substrate was partially etched. The reason is considered as follows: since the second nitride semiconductor layer to be grown at a higher temperature than the first nitride semiconductor layer was directly formed on the buffer layer, the buffer layer migrated (or crystallized) too much and thus did not sufficiently protect some portion of the surface of the $Ga_2O_3$ substrate. On the other hand, in Sample 2, the $Ga_2O_3$ substrate was etched when forming the buffer layer since the growth temperature of the buffer layer was too high.

Samples 5 and 6 for use in LEDs with a short wavelength. Also in Sample 7, none of cracks and pits were generated.

In all of Samples 1 to 7, dislocation density in the second nitride semiconductor layer was suppressed to not more than $2.0 \times 10^{10}$ cm$^{-2}$.

It is understood from the evaluation results of Samples 1 to 7 that the conditions to obtain the second nitride semiconductor layer with a good surface state are that the first and second nitride semiconductor layers are both formed, that the Al composition of the second nitride semiconductor layer is smaller than that of the first nitride semiconductor layer, and that the growth temperature of the second nitride semiconductor layer is more than 1100° C.

Figure 2A:
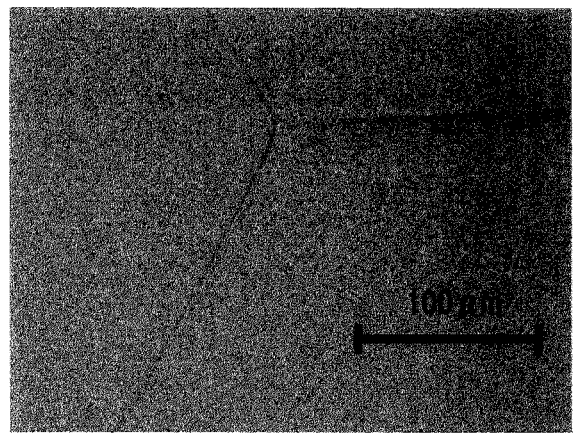
FIGS. 2A, 2B and 2C are images showing surfaces of respective second nitride semiconductor layers of Samples 1, 4 and 5, respectively, observed under an optical microscope.
Figure 2B:
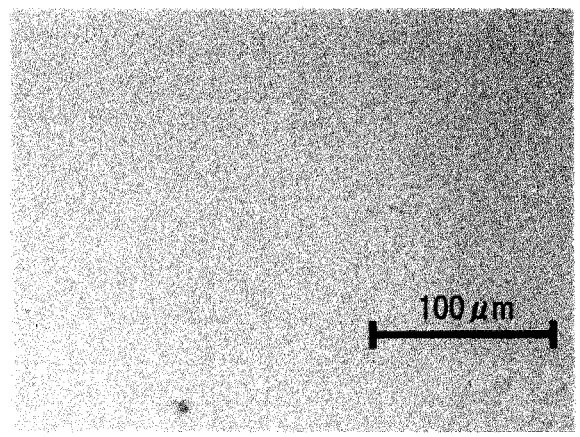
Figure 2C:
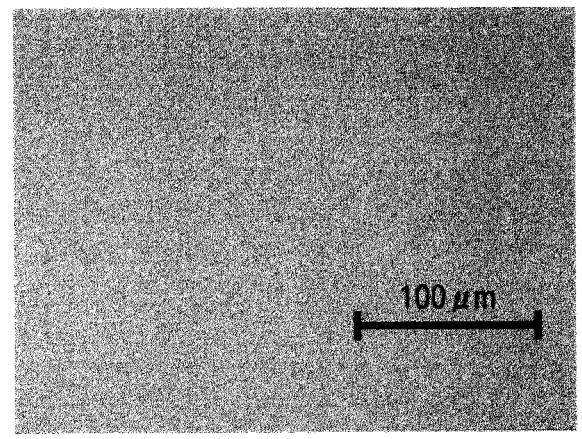

FIGS. 2A, 2B and 2C are images of the surfaces of the respective second nitride semiconductor layers of Samples 1, 4 and 5 observed under an optical microscope. As shown in Table 1, cracks are observed on the surface of the second nitride semiconductor layer of Sample 1 shown in FIG. 2A, and pits are observed on the surface of the second nitride semiconductor layer of Sample 4 shown in FIG. 2B. On the other hand, none of cracks and pits are observed on the surface of the second nitride semiconductor layer of Sample 5 shown in FIG. 2C.

Figure 3:
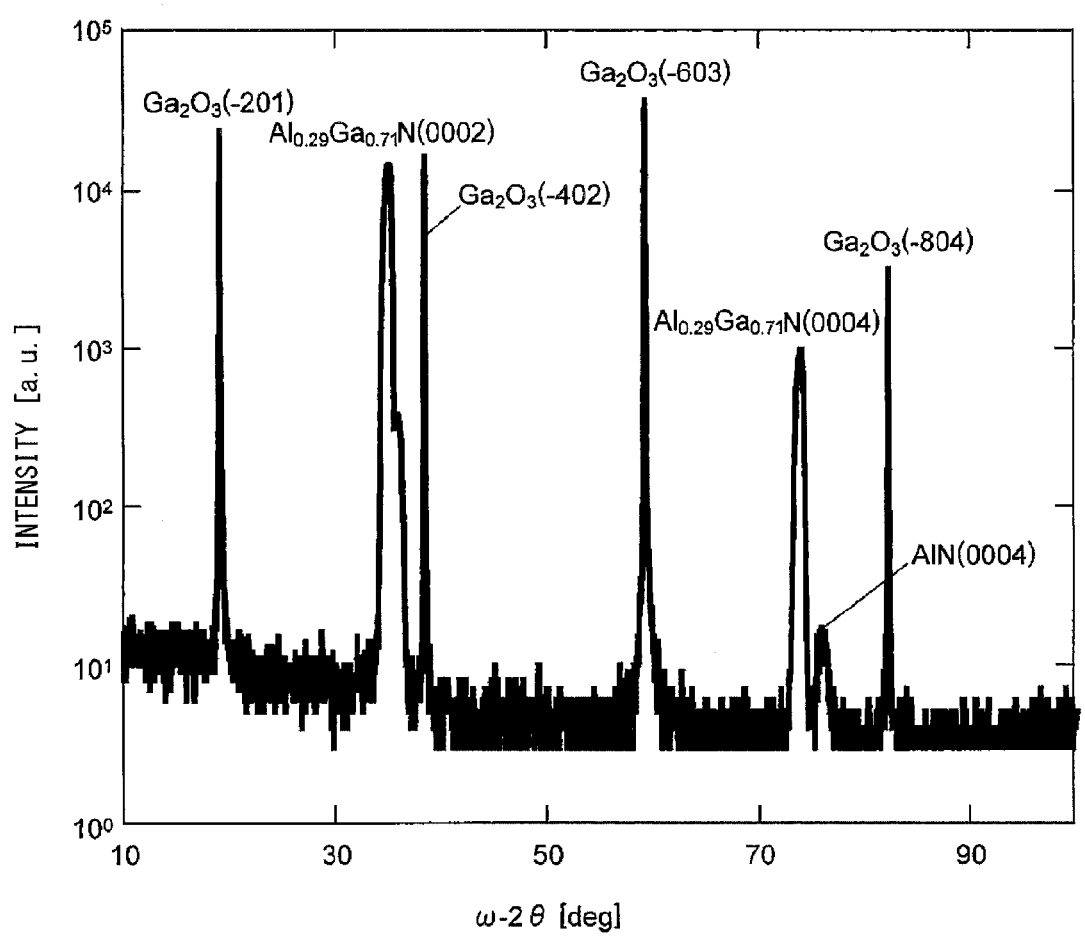
FIG. 3 is a diagram showing an X-ray diffraction pattern of the second nitride semiconductor layer of Sample 5 obtained using a symmetrical reflection method.

FIG. 3 is diagram showing an X-ray diffraction pattern of the second nitride semiconductor layer of Sample 5. The X-ray diffraction pattern only has peaks of diffraction from the $Ga_2O_3$ substrate at a (−201) plane and planes parallel to the (−201) plane, from AlN as the first nitride semiconductor layer at a plane parallel to a (0001) plane and from $Al_{0.3}Ga_{0.7}N$ as the second nitride semiconductor layer at planes parallel to a (0001) plane, and shows that the second nitride semiconductor layer does not have a phase grown in a different direction. The Al composition is shown as $Al_{0.29}Ga_{0.71}N$ in FIG. 3 since the Al composition of $Al_{0.3}Ga_{0.7}N$ was actually 0.29 as a result of calculation based on complete lattice relaxation derived from the peak position.

Meanwhile, as a result of x-ray rocking curve measurement on the second nitride semiconductor layer of Sample 5, the full width at half maximum of diffraction peak from a (0002) plane was 1164 arcseconds and the full width at half maximum of diffraction peak from a (1-102) plane was 1536 arcseconds.

Figure 4:
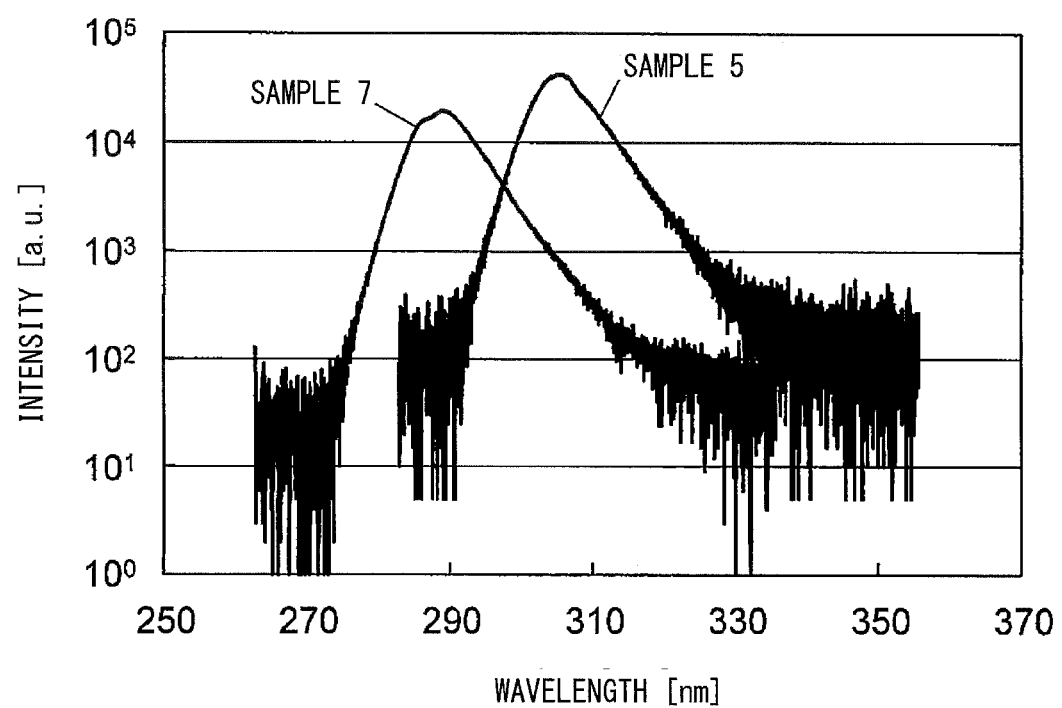
FIG. 4 is a diagram showing photoluminescence spectra of the second nitride semiconductor layers in Samples 5 and 7.

FIG. 4 is a diagram showing photoluminescence spectra of the second nitride semiconductor layers of Samples 5 and 7. These spectra were obtained by photoluminescence measurement using excitation light with a wavelength of 244 nm at room temperature, and peaks respectively at wavelengths of 305 nm and 289 nm probably due to band edge emission are shown as main peaks.

When the second nitride semiconductor layer 14 has a composition expressed by $Al_yGa_{1-y}N$ (0.2≤y≤0.55), the band-edge emission wavelength thereof is 265 to 320 nm and it is possible to suitably use the second nitride semiconductor layer 14 as a cladding layer of a UV LED with an emission wavelength of 300 to 360 nm.

Evaluation of Third Nitride Semiconductor Layer

Figure 5:
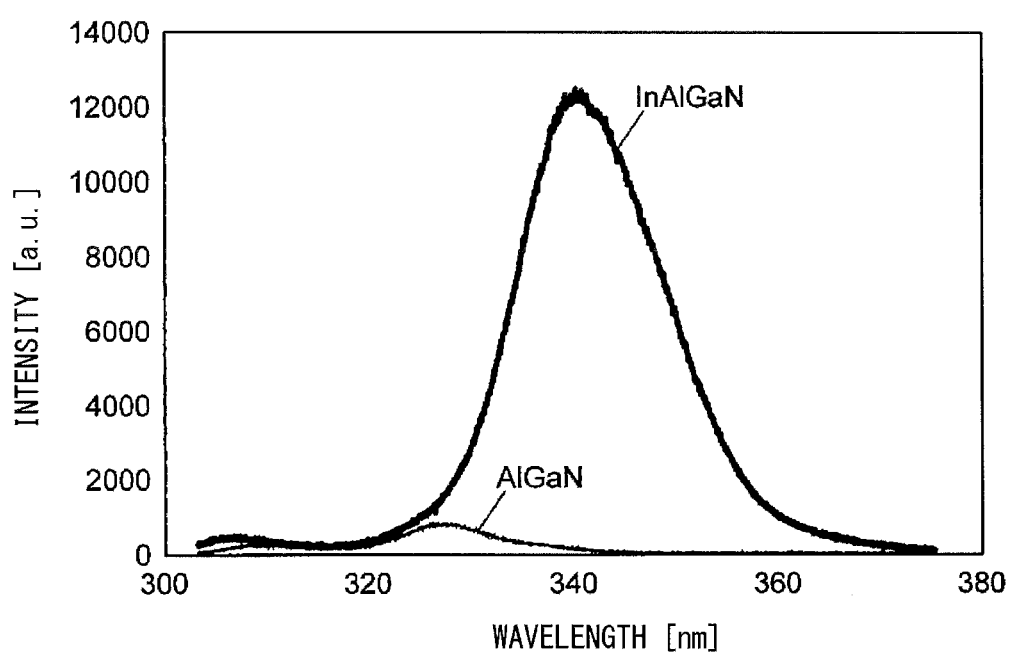
FIG. 5 is a diagram showing a photoluminescence spectrum of a third nitride semiconductor layer.

FIG. 5 is a diagram showing a photoluminescence spectrum of the third nitride semiconductor layer 15. This photoluminescence measurement was conducted on the third nitride semiconductor layer 15 having a quantum well structure composed of three $In_{0.02}Al_{0.19}Ga_{0.79}N$ layers as well layers and four $In_{0.02}Al_{0.29}Ga_{0.69}N$ layers as barrier layer in total, two of which are formed between the $In_{0.02}Al_{0.19}Ga_{0.79}N$ layers and one as the uppermost layer and one as the lowermost layer. Meanwhile, as Comparative Example, photoluminescence measurement was also conducted on a nitride semiconductor layer which does not contain In and has a quantum well structure composed of three $Al_{0.2}Ga_{0.8}N$ layers as well layers and four $Al_{0.3}Ga_{0.7}N$ layers as barrier layer in total, two of which are formed between the $Al_{0.2}Ga_{0.8}N$ layers and one as the uppermost layer and one as the lowermost layer.

In FIG. 5, the photoluminescence spectrum of the third nitride semiconductor layer 15 is indicated by "InAlGaN" and the photoluminescence spectrum in Comparative Example is indicated by "AlGaN". These spectra were obtained by photoluminescence measurement using excitation light with a wavelength of 244 nm at room temperature.

FIG. 5 shows that photoluminescence intensity of the third nitride semiconductor layer 15 in the first embodiment is significantly higher than photoluminescence intensity in Comparative Example. This is because the third nitride semiconductor layer 15 contains In and thus has high internal quantum efficiency.

Second Embodiment

The second embodiment is a UV LED including the nitride semiconductor template 10 in the first embodiment.

Structure of Semiconductor Device

Figure 6:
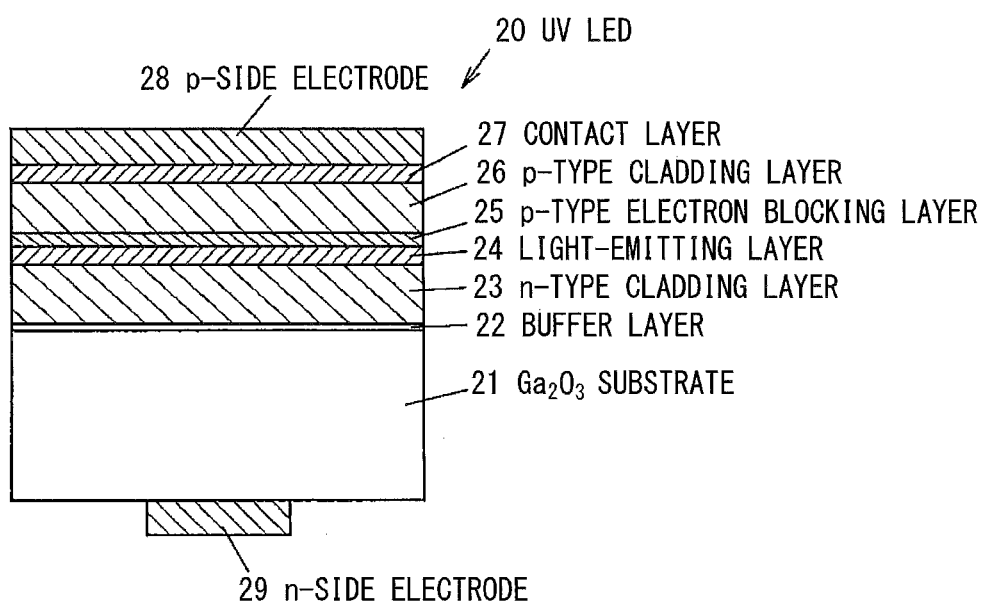
FIG. 6 is a vertical cross-sectional view showing a UV LED in a second embodiment.

FIG. 6 is a vertical cross-sectional view showing a UV LED 20 in the second embodiment. The UV LED 20 has a $Ga_2O_3$ substrate 21, a buffer layer 22 on the $Ga_2O_3$ substrate 21, an n-type cladding layer 23 on the buffer layer 22, a light-emitting layer 24 on the n-type cladding layer 23, a p-type electron blocking layer 25 on the light-emitting layer 24, a p-type cladding layer 26 on the p-type electron blocking layer 25, a contact layer 27 on the p-type cladding layer 26, a p-side electrode 28 on the contact layer 27, and an n-side electrode 29 on a surface of the $Ga_2O_3$ substrate 21 opposite to the buffer layer 22.

Here, the $Ga_2O_3$ substrate 21 and the buffer layer 22 respectively correspond to the $Ga_2O_3$ substrate 11 and the buffer layer 12 which constitute the nitride semiconductor template 10 in the first embodiment. In addition, the n-type cladding layer 23 corresponds to the first nitride semiconductor layer 13 and the second nitride semiconductor layer 14 which constitute the nitride semiconductor template 10 in the first embodiment. Furthermore, the light-emitting layer 24 corresponds to the third nitride semiconductor layer 15 which constitutes the nitride semiconductor template 10 in the first embodiment.

The p-type electron blocking layer 25 is, e.g., a 30 nm-thick $In_{0.02}Al_{0.39}Ga_{0.59}N$ layer. The p-type electron blocking layer 25 can be formed at the same growth temperature as for the light-emitting layer 24 (the third nitride semiconductor layer 15). In addition, source gases used to form the electron blocking layer 25 can be the same as those used to form the light-emitting layer 24 (the third nitride semiconductor layer 15).

The p-type cladding layer 26 is, e.g., a 100 nm-thick $In_{0.02}Al_{0.29}Ga_{0.69}N$ layer. The p-type cladding layer 26 can be formed at the same growth temperature as for the light-emitting layer 24 (the third nitride semiconductor layer 15). In addition, source gases used to form the p-type cladding layer 26 can be the same as those used to form the light-emitting layer 24 (the third nitride semiconductor layer 15).

The contact layer 27 is, e.g., a 20 nm-thick $In_{0.02}Al_{0.29}Ga_{0.69}N$ layer. The contact layer 27 can be formed at the same growth temperature as for the light-emitting layer 24 (the third nitride semiconductor layer 15). In addition, source gases used to form the contact layer 27 can be the same as those used to form the light-emitting layer 24 (the third nitride semiconductor layer 15).

The p-side electrode 28 is an electrode in ohmic contact with the contact layer 27 and is formed of, e.g., Al. The n-side electrode 29 is an electrode in ohmic contact with the $Ga_2O_3$ substrate 21 and has, e.g., a Ti/Au laminate structure.

The UV LED 20 is, e.g., an LED chip configured to extract light on the $Ga_2O_3$ substrate 21 side and is mounted on a CAN type stem using Al deposited thereon.

Evaluation of Emission Characteristics of UV LED

Figure 7:
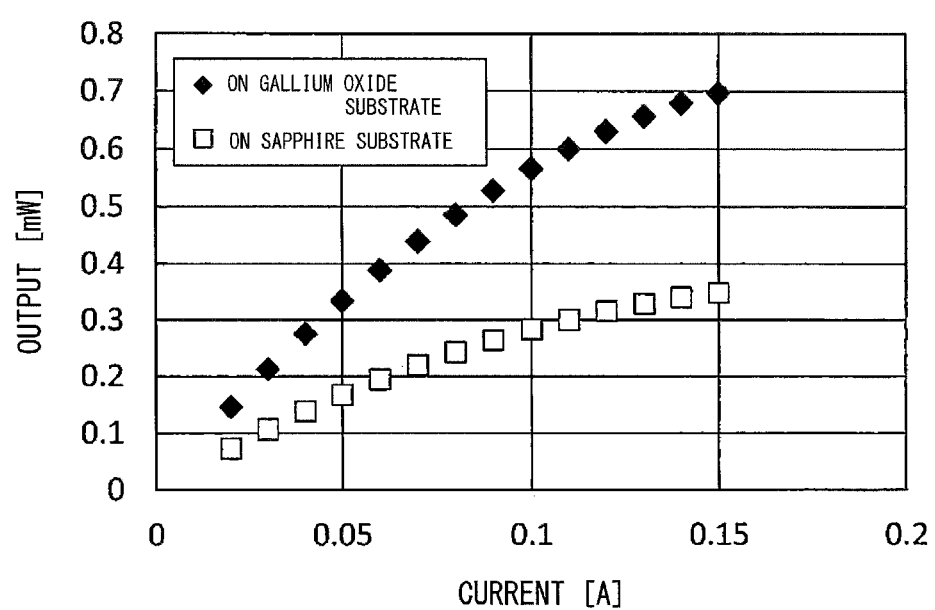
FIG. 7 is a graph showing a relation between an electric current applied to the UV LED and light output.

FIG. 7 is a graph showing a relation between an electric current applied to the UV LED 20 and light output. The light output measurement was conducted on the UV LED 20 of 400 μm×600 μm in chip size in which the light-emitting layer 24 (the third nitride semiconductor layer 15) has three multi-quantum-well structures each formed by laminating an $In_{0.02}Al_{0.29}Ga_{0.69}N$ layer on an $In_{0.02}Al_{0.19}Ga_{0.79}N$ layer. Meanwhile, as Comparative Example, light output measurement was also conducted on an LED formed using a sapphire substrate in place of the $Ga_2O_3$ substrate 21. The compositions of the layers, except the substrate, of the LED in Comparative Example are the same as those of the UV LED 20 subjected to the light output measurement.

According to FIG. 7, light output of the UV LED 20 is, e.g., about 700 μm at an applied current of 150 mA. On the other hand, light output of the LED in Comparative Example formed on the sapphire substrate is about 350 μm at an applied current of 150 mA. This confirms superiority of the UV LED 20 formed on the gallium oxide substrate in terms of light output.

Effects of the Embodiments

In the first embodiment, it is possible to obtain a nitride semiconductor template which has a high-quality nitride semiconductor on a $Ga_2O_3$ substrate and is suitable for a UV LED with an emission wavelength of 300 to 360 nm.

Then, in the second embodiment, it is possible to manufacture a high-quality UV LED in a high yield by using such a high-quality nitride semiconductor template 10.

Although the embodiments of the invention have been described, the invention is not intended to be limited to the embodiments, and the various kinds of modifications can be implemented without departing from the gist of the invention.

In addition, the invention according to claims is not to be limited to embodiments. Further, it should be noted that all combinations of the features described in the embodiments are not necessary to solve the problem of the invention.

What is claimed is:

1. A nitride semiconductor template, comprising:
   a $Ga_2O_3$ substrate;
   a buffer layer that comprises as a main component AlN and is formed on the $Ga_2O_3$ substrate;
   a first nitride semiconductor layer that comprises as a main component $Al_xGa_{1-x}N$ (0.2<x≤1) and is formed on the buffer layer;
   a second nitride semiconductor layer that comprises as a main component $Al_yGa_{1-y}N$ (0.2≤y≤0.55, y<x) and is formed on the first nitride semiconductor layer; and
   a third nitride semiconductor layer that is formed on the second nitride semiconductor layer and comprises a multilayer structure including an $In_{u1}Al_{v1}Ga_{w1}N$ (0.02≤u1≤0.03, u1+v1+w1=1) layer and $In_{u2}Al_{v2}Ga_{w2}N$ (0.02≤u2≤0.03, u2+v2+w2=1, v1+0.05≤v2≤v1+0.2) layers on both sides of the $In_{u1}Al_{v1}Ga_{w1}N$ layer.

2. An ultraviolet LED, comprising the nitride semiconductor template according to claim 1.

3. The nitride semiconductor template according to claim 1, wherein the second nitride semiconductor layer has a dislocation density of not more than $2.0\times10^{10}$ cm$^{-2}$.

4. An ultraviolet LED, comprising the nitride semiconductor template according to claim 3.

5. The nitride semiconductor template according to claim 1, wherein the second nitride semiconductor layer has no pit on a surface thereof.

6. The nitride semiconductor template according to claim 5, wherein the second nitride semiconductor layer has a dislocation density of not more than $2.0\times10^{10}$ cm$^{-2}$.

7. An ultraviolet LED, comprising the nitride semiconductor template according to claim 5.

8. The nitride semiconductor template according to claim 1, wherein the second nitride semiconductor layer has no crack on a surface thereof.

9. The nitride semiconductor template according to claim 8, wherein the second nitride semiconductor layer has no pit on a surface thereof.

10. The nitride semiconductor template according to claim 8, wherein the second nitride semiconductor layer has a dislocation density of not more than $2.0\times10^{10}$ cm$^{-2}$.

11. An ultraviolet LED, comprising the nitride semiconductor template according to claim 8.

12. The nitride semiconductor template according to claim 1, wherein the buffer layer is not more than 10 nm in thickness.

13. The nitride semiconductor template according to claim 12, wherein the second nitride semiconductor layer has no crack on a surface thereof.

14. The nitride semiconductor template according to claim 12, wherein the second nitride semiconductor layer has no pit on a surface thereof.

15. The nitride semiconductor template according to claim 12, wherein the second nitride semiconductor layer has a dislocation density of not more than $2.0\times10^{10}$ cm$^{-2}$.

16. An ultraviolet LED, comprising the nitride semiconductor template according to claim 12.

* * * * *